United States Patent
Kingston (10) Patent No.: US 9,609,769 B2
(45) Date of Patent: Mar. 28, 2017

(54) SYSTEM AND METHOD FOR VENTILATING AND ISOLATING ELECTRICAL EQUIPMENT

(75) Inventor: Murray Peter Kingston, Cambridge (CA)

(73) Assignee: Rockwell Automation Technologies, Inc., Milwaukee, WI (US)

(*) Notice: Subject to any disclaimer, the term of this patent is extended or adjusted under 35 U.S.C. 154(b) by 1899 days.

(21) Appl. No.: 12/846,511

(22) Filed: Jul. 29, 2010

(65) Prior Publication Data
US 2012/0028559 A1 Feb. 2, 2012

(51) Int. Cl.
H05K 5/02 (2006.01)
H01H 9/34 (2006.01)
H02B 13/045 (2006.01)
H02B 1/56 (2006.01)

(52) U.S. Cl.
CPC ........... *H05K 5/0213* (2013.01); *H01H 9/342* (2013.01); *H02B 1/565* (2013.01); *H02B 13/045* (2013.01)

(58) Field of Classification Search
USPC .... 454/184, 369, 333; 361/690, 692, 2, 134; 312/409
See application file for complete search history.

(56) References Cited

U.S. PATENT DOCUMENTS

| | | | | |
|---|---|---|---|---|
| 671,915 A * | 4/1901 | Curtis | ................... | B26D 7/2642 29/6.1 |
| 2,203,084 A * | 6/1940 | Evans | ...................... | B65D 5/02 229/101 |
| 2,656,291 A * | 10/1953 | Doll | ........................ | B65D 65/44 112/437 |
| 2,989,145 A * | 6/1961 | Goodloe | ................. | B01D 39/12 29/896.62 |
| 3,051,365 A * | 8/1962 | Sayford, Jr. | ............. | B65D 3/28 229/117.23 |
| 3,065,785 A * | 11/1962 | Taber | ...................... | A47H 23/04 160/237 |
| 3,192,306 A * | 6/1965 | Skonnord | .......... | H05K 7/20572 165/80.3 |
| 3,642,967 A * | 2/1972 | Doll | .................... | B29C 44/5636 220/676 |
| 3,756,907 A * | 9/1973 | Heling | ..................... | D04H 1/00 156/229 |
| 3,781,183 A * | 12/1973 | Doll | ....................... | B29C 51/004 156/250 |
| 5,710,402 A * | 1/1998 | Karnbach | ............ | H02B 13/025 218/157 |
| 5,744,213 A * | 4/1998 | Nelson | ..................... | B27M 1/04 312/213 |

(Continued)

*Primary Examiner* — Gregory Huson
*Assistant Examiner* — Martha Becton
(74) *Attorney, Agent, or Firm* — Fletcher Yoder P.C.

(57) ABSTRACT

According to various embodiments, a system includes a power center or other electrical system. The system includes an enclosure having a ventilation opening and an isolation assembly. The isolation assembly includes a deformable portion and a blocking portion. The blocking portion is capable of substantially blocking the ventilation opening with a blocking surface. The deformable portion is configured to deform due to a level of pressure being applied to the isolation assembly such that the deformable portion plastically deforms and carries the blocking surface toward the ventilation opening.

19 Claims, 6 Drawing Sheets

(56) References Cited

U.S. PATENT DOCUMENTS

| | | | |
|---|---|---|---|
| 5,892,195 A * | 4/1999 | Aufermann | H02B 13/025 218/157 |
| 6,222,147 B1 * | 4/2001 | Doughty et al. | 218/157 |
| 6,342,004 B1 * | 1/2002 | Lattimore et al. | 454/184 |
| 6,629,016 B1 * | 9/2003 | Smith | B21D 31/043 29/6.1 |
| 6,646,867 B1 * | 11/2003 | Tuttle et al. | 361/679.6 |
| 6,680,847 B2 * | 1/2004 | Heard | 361/692 |
| 6,989,075 B1 * | 1/2006 | Kao | A61K 8/0208 162/123 |
| 7,095,606 B2 * | 8/2006 | Mahn et al. | 361/612 |
| 7,140,702 B2 * | 11/2006 | Byron et al. | 312/296 |
| 7,236,352 B2 * | 6/2007 | Dalis | 361/608 |
| 8,842,421 B2 * | 9/2014 | Gingrich | H01H 33/53 174/17 VA |
| 2002/0117901 A1 * | 8/2002 | Spivey et al. | 307/117 |
| 2007/0097604 A1 * | 5/2007 | Bruski et al. | 361/605 |
| 2009/0185333 A1 * | 7/2009 | Coomer et al. | 361/622 |
| 2013/0143478 A1 * | 6/2013 | Arcos | H02B 13/025 454/184 |

\* cited by examiner

FIG. 11

SYSTEM AND METHOD FOR VENTILATING AND ISOLATING ELECTRICAL EQUIPMENT

BACKGROUND

The invention relates generally to the field of electrical systems and enclosures, such as enclosures utilized with motor control centers (MCCs). Specifically, the invention relates to techniques for ventilating and isolating such systems.

Electrical systems may be used in residences, commercial applications, or a variety of industries to provide, manage, and/or control electrical power provided to equipment, machines, and/or processes. These electrical systems may be installed in enclosures, such as MCCs, for a number of reasons. For example, the enclosures may help to protect the electrical systems from external conditions, such as dust, debris, animals, weather, unauthorized access, collisions, and so forth. In addition, the enclosures may help to contain and/or redirect internal conditions associated with the electrical systems. For example, arcing faults may create heat, gases, melted metal, shrapnel, and other debris that may be ejected by the affected electrical system. Thus, enclosures may help to protect not only electrical equipment, but also nearby personnel and/or equipment.

BRIEF DESCRIPTION

In one embodiment, a system includes an enclosure having a ventilation opening and an isolation assembly. The isolation assembly includes a deformable portion and a blocking portion. The blocking portion is capable of substantially blocking the ventilation opening with a blocking surface. The deformable portion is configured to deform due to a level of pressure being applied to the isolation assembly such that the deformable portion plastically deforms and carries the blocking surface toward the ventilation opening.

In another embodiment, an isolation assembly for an electrical enclosure includes an attachment feature, a deformable portion, and a blocking portion. The attachment feature is configured to couple the isolation assembly to the electrical enclosure adjacent a ventilation opening in the electrical enclosure. The blocking portion is capable of substantially blocking the ventilation opening with a blocking surface. The deformable portion is configured to deform due to a level of pressure being applied to the isolation assembly such that the deformable portion plastically deforms and carries the blocking surface toward the ventilation opening.

In yet another embodiment, a method includes substantially blocking a ventilation opening of an electrical enclosure using a blocking portion of an isolation assembly and deforming a deformable portion of the isolation assembly due to a level of pressure being applied to the isolation assembly such that the deformable portion plastically deforms and carries a blocking surface toward the ventilation opening.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Electrical systems can be complex and widely divergent in design and operation. Electrical power from these electrical systems may be applied to loads, such as electric motors and other equipment. In one exemplary approach, collective assemblies of protective devices, control devices, switchgear, controllers, and so forth are located in enclosures, such as MCCs. The MCC may manage both application of electrical power, as well as data communication, to the loads, such loads typically including various machines or motors. Within the MCC may be disposed a variety of components or devices used in the operation and control of the loads. Exemplary devices contained within the MCC are motor starters, overload relays, circuit breakers, and solid-state motor control devices, such as variable frequency drives, programmable logic controllers, and so forth.

It is now recognized that a problem in the operation of MCCs and other power management systems, such as switchboards and panelboards, is the occurrence of arcing (also called an arc, arc fault, arcing fault, arc flash, or arcing flash) which may be thought of as an electrical conduction or short circuit through gas or air. Initiation of an arc fault may be caused by a momentary or loose connection, build-up of foreign matter, such as dust or dirt mixed with moisture, insulation failure, or a short-circuit (e.g., a foreign object, such as a tool or a rodent, establishing an unwanted connection between phases or from a phase to ground) that causes the arc to be drawn, and so forth. Once initiated, arcing faults may proceed in a substantially continuous manner. On the other hand, arcing faults may be intermittent failures between phases or phase-to-ground, and may be discontinuous currents that alternately strike, extinguish, and strike again.

In either case, the result is an intense thermal event (e.g., temperatures up to 8800 degrees Celsius) causing melting and vaporization of metals. An arcing fault is an extremely rapid chain of events releasing tremendous energy in a fraction of a second, and is known for quick propagation. Once the arcing begins, heat is generated and ionized gases are produced that provide a medium by which the arcing fault can propagate. An arc may travel along one conductor and jump to other conductors, melting and/or vaporizing the conductors. As a result, more ionized gas and arcing may be created, engulfing all three phases and reaching the power buses. A phase-to-ground or phase-to-phase arcing fault can quickly escalate into a three-phase arcing fault because of the extensive cloud of conductive metal vapor, which can surround the power leads and terminals. If not contained, the arc may propagate throughout the entire MCC, especially if the arc reaches the power buses. Arcing faults can cause damage to equipment and facilities, and increase costs because of lost production.

Figure 1:
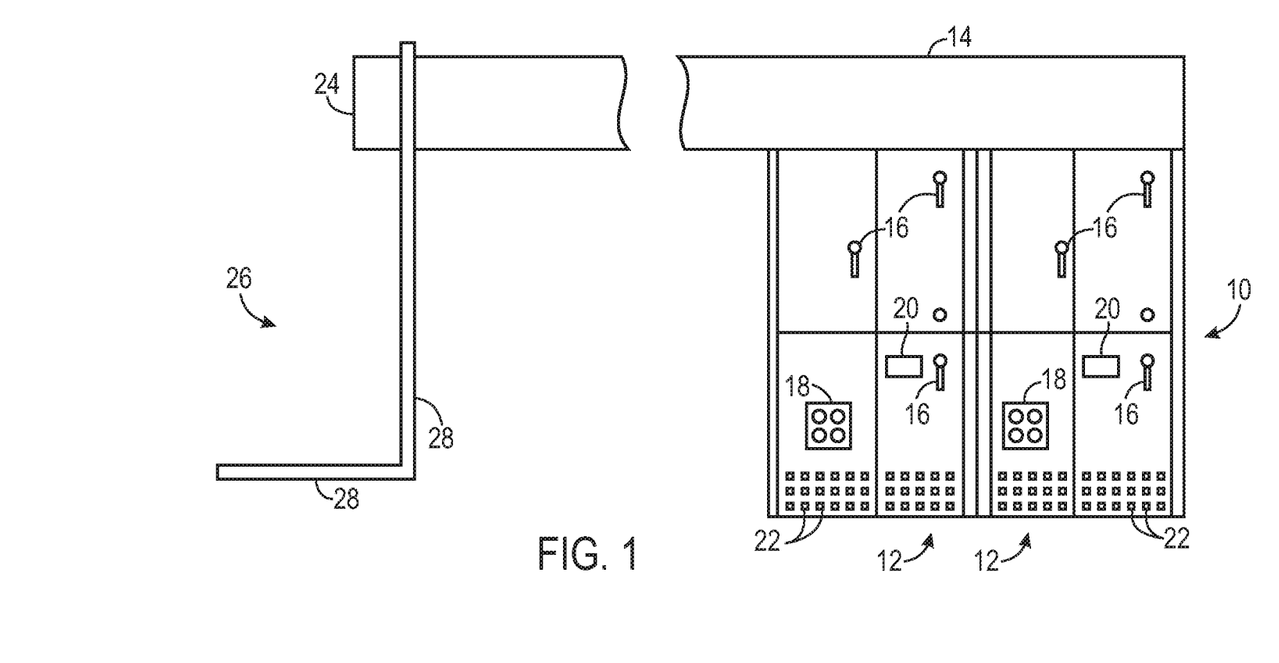
FIG. 1 is a front view of a row of exemplary MCCs having an isolation assembly in accordance with an embodiment of the present invention.

FIG. 1 is a front view of a row 10 of MCCs 12 having a shared exhaust plenum 14 and isolation assemblies in accordance with an embodiment of the present invention. An MCC 12 is an enclosure that may include protective devices, control devices, switchgear, controllers, and so forth. Though the present technique is discussed in the context of MCCs, the technique may apply to electrical enclosures in general, such as any enclosure utilized to contain switchboards, switchgear, panelboards, pull boxes, junction boxes, cabinets, other electrical enclosures, and so forth. The exhaust plenum 14, also referred to as an exhaust ducting, provides an outlet for any exhaust generated by the MCCs 12, such as in the case of an arc fault. The row 10 may comprise any number of MCCs 12, and the MCCs 12 may be arranged in any configuration. For example, the MCCs 12 may be arranged perpendicular to each other, in parallel rows, in perpendicular rows, or in any other configuration. Such a configuration may be designed to minimize the footprint of the MCCs 12 in a room in which the MCCs 12 are located. Alternatively, the arrangement of the MCCs 12 may be chosen so that the exit of the exhaust plenum 14 is conveniently located.

The MCCs 12 may be classified according to the voltages the MCCs 12 are rated to handle. For example, some MCCs 12 may be rated for medium voltage, which may be defined as covering a range between approximately 2,000 volts to 15,000 volts, or 2,000 volts to 25,000 volts. Isolation assemblies in accordance with present embodiments may be used in medium voltage MCCs 12, as well as low voltage MCCs, high voltage MCCs, or MCCs of any rating. In addition, some MCCs 12 may be further designated as arc resistant, which means the MCCs 12 are configured to direct the energy released during an arc fault in ways that minimize undesirable results. Because of the constraints of traditional arc resistant equipment design, such MCCs 12 may have limited or no ventilation. For example, such traditional enclosures may avoid the use of ventilation openings because of the potential of arc faults. However, as described in detail below, the isolation assemblies in accordance with present embodiments may be installed in arc resistant MCCs 12 to both ventilate internal components and to help to prevent damage during an arc fault. In further embodiments, the isolation assemblies may be installed in MCCs that are not arc resistant.

In addition to MCCs, in certain embodiments, the isolation assemblies may be used with other electrical equipment, such as power centers, motor starters, motor controllers, switchgear, distribution gear, and so forth. Such electrical equipment may or may not be arc resistant and may be rated with a variety of classifications. In addition, in further embodiments, the isolation assemblies may be used with appropriate configuration in a variety of applications, which may include, but are not limited to, chemical plants, refineries, pulp and paper plants, oil pipelines, offshore oil drilling rigs, cement plants, marine propulsion, and so forth.

Returning to FIG. 1, the front of the MCCs 12 includes various control inputs, indicators, displays, electrical outputs, air outputs, and so forth. For example, each MCC 12 has an access mechanism 16, such as a handle, knob, or the like. The access mechanisms 16 may be locked, such as with a key, padlock, or any other locking device. Alternatively, in some embodiments, the access mechanisms 16 may be electronically locked, and/or access may be electronically controlled. Further, in an embodiment, each MCC 12 may include a user input 18 that may include a button or knob configured to enable selection of a mode of operation, power on/off, emergency shutoff, adjustment of any parameter, or a combination thereof. The front of the MCCs 12 may also include various indicators 20 to provide feedback to a user. For example, the indicators 20 may include one or more light emitting diodes (LED) and/or liquid crystal displays (LCD) to display on/off status, current level, voltage level, temperature, or any other parameter. Additionally, the indicators 20 may include an LED or LCD that displays a trouble or warning indicator if there is a problem with the MCC 12.

As mentioned earlier, arc faults may occur in the MCCs 12 for a variety of reasons. It has been well documented that the incident energy of an arcing fault is directly proportional to the time the fault persists. As the arcing fault flows for 6, 12, or 30 cycles or more, for example, the incident energy and force of the arc fault increases dramatically. Thus, circuit breakers, for example, on the line side operating with typical time delays (e.g., greater than 6 cycles) may be problematic with arcing faults. In general, it is desirable that the arcing fault be extinguished in a short time, such as within 6 cycles, and in certain applications, in less than 2 cycles. Testing has shown that if the arc (e.g., for 65,000 amps available current at 480 volts) does not extinguish quickly (e.g., in less than 0.1 seconds or six cycles), it can cause extensive damage. Moreover, although the amount of energy released in an arc flash may be greater for higher voltage installations, such as those found in petrochemical and other industrial plants, the sheer volume of lower voltage equipment in commercial and industrial facilities means that such installations account for a great number of arc flash incidents. Thus, there has been interest in arc flash protection for medium and low voltage MCCs, in addition to interest for protection of high voltage systems. Finally, there are several industry and regulatory standards around the world that govern arc flash prevention, such as IEEE/ANSI C37.20.7 and IEC 62271 Type 2 requirements.

Because the plenum 14 is configured to primarily direct exhaust from an arc fault away from the MCC 12, the plenum 14 may not be configured to provide adequate ventilation for the internal components of the MCC 12 that may generate heat during normal operation. Without adequate ventilation, the build up of such heat may cause internal temperatures of the MCC 12 to exceed maximum recommended guidelines established for longevity of equipment and so forth. Although ventilation may be accomplished by providing openings in one or more external surfaces of the MCC 12, such openings may enable the exhaust from arc faults to reach areas not designed to be exposed to such hot gases and vaporized metals.

To provide improved ventilation, the front of the MCCs 12 may include ventilation openings 22, which enable the interior of the MCCs 12 to be ventilated. Furthermore, as described in detail below, isolation assemblies may be located inside the MCCs 12 and directly behind the ventilation openings 22 to help reduce the quantity of exhaust from an arc fault exiting the MCCs 12. In other words, the isolation assembly may be mounted on an interior surface (e.g., inside surface of a door) of the MCC 12, such that activation of the isolation assembly blocks, or covers, the ventilation openings 22. The ventilation openings 22 may enable heat generated by the internal components of the MCCs 12 to be removed from the MCCs 12. Alternatively, the ventilation openings 22 may enable air to enter and cool the internal components of the MCCs 12. Each ventilation opening 22 may be sized to help reduce the possibility of objects, such as tools, rodents, or similar items, entering the interior of the MCCs 12. For example, in certain embodiments, each ventilation opening 22 may be between approximately 2 mm to 20 mm, 5 mm to 15 mm, or 8 mm to 10 mm across. In addition, the ventilation openings 22 may be spaced apart by a distance between approximately 5 mm to 30 mm, 10 mm to 25 mm, or 15 mm to 20 mm. In other embodiments, a screen may cover the ventilation openings 22 to help reduce the possibility of foreign objects entering the MCCs 12. For example, in certain embodiments, the openings of the screen may be between approximately 0.5 mm to 5 mm, 1 mm to 4 mm, or 2 mm to 3 mm. Although shown in FIG. 1 near the bottom of the MCCs 12, the ventilation openings 22 may be located anywhere on the front, side, or other surfaces of the MCCs 12. Moreover, the number, shape, pattern, arrangement, size, and/or location of the ventilation openings may be configured to provide a desired level of ventilation of the MCCs 12. For example, the desired level of ventilation may be based on a volumetric rate of air exchange or maintaining the interior of the MCC 12 at a specified temperature or below.

As illustrated in FIG. 1, the exhaust plenum 14 is connected to the top of the MCCs 12 and extends to the left of the row 10. In one embodiment, the plenum 14 may be formed from sheet metal ductwork. In other embodiments, the plenum 14 may be formed from aluminum or other metals, plastics, composites, ceramics, cermets, or any other suitable material. The exhaust plenum 14 may be modular and may be configured to provide an exit in any number of directions from the top of the row 10 of MCCs 12. The exhaust plenum 14 may extend for any length, and the length may be adapted to the particular location of the MCCs 12. The exhaust plenum 14 includes an outlet 24 through which any hot vapor, flame, or other exhaust material may exit because of an arc fault. Any number of plenums 14 or outlets 24 may be used in particular applications. For example, in one embodiment, one outlet 24 may be used for every five MCCs 12.

In the embodiment, the outlet 24 of the plenum 14 is directed to an external area 26 (e.g., environment external to a building). For example, the external area 26 may be an area open to the outside, such as in a location designated as an arc fault relief location and appropriately blocked off from access. The external area 26 may be separated from the room containing the MCCs 12 via reinforced walls 28. The walls 28 may be designed to withstand any pressure, heat, or other energy caused by an arc fault; thus, the walls 28 may isolate the MCCs 12 from the hot vapor or other material exiting the outlet 24 in the case of an arc fault. For example, the walls 28 may be made from reinforced concrete or steel.

In other embodiments, the outlet 24 of the plenum 14 may be directed to an internal area, such as a containment room. Location of the outlet 24 within the internal area may prevent certain types of wear or damage. For example, when the plenum 14 is open to the atmosphere, water from outside may ingress, which may result in damage to the MCC 12 or other equipment in the electrical control room. The containment room may include any number of devices to reduce or absorb the hot gases and flames exiting the outlet 24 in the event of an arc fault. For example, the containment room may include fire suppression devices, such as water sprinklers or foam sprayers, and may include its own exhaust or active venting system to remove the hot gases and relieve temperature or pressure.

Figure 2:
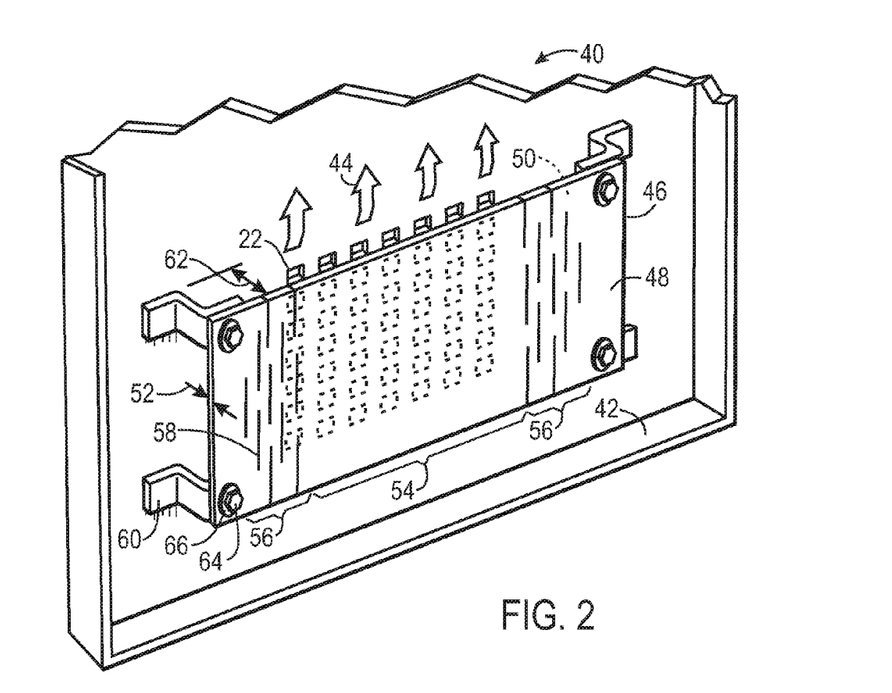
FIG. 2 is a perspective view of an isolation assembly located inside an MCC in accordance with an embodiment of the present invention.

Turning next to examples of isolation assemblies, FIG. 2 shows a perspective view of an isolation assembly 40 mounted inside a door 42 of an MCC 12. The ventilation openings 22 are shown near the bottom of the door 42. In other embodiments, the ventilation openings 22 may be located elsewhere on the door 42. Fresh air 44 enters the MCC 12 through the ventilation openings 22. As described above, warm air from the interior of the MCC 12 may also be able to exit through the ventilation openings 22. The isolation assembly 40 may include a metal sheet 46 with an inner surface 48, which faces in the direction of the internal component of the MCC 12 and the source of any potential arc fault, and an outer surface 50, which faces the ventilation openings 22 in the door 42 of the MCC 12. The outer surface 50 may be referred to as a blocking surface. The metal sheet 46 may be made from various ductile metals, including, but not limited to, aluminum and steel. Other flexible, flame resistant materials may also be used. In addition, the metal sheet 46 may have a thickness 52, which may be between approximately 0.5 mm to 5 mm, 0.75 mm to 3 mm, or 1 mm to 2 mm. An example of such a metal sheet 46 is 16-gauge aluminum. Further, the metal sheet 46 may be divided into a blocking portion 54 and one or more deformable portions 56. The blocking portion 54 is configured to substantially block the ventilation openings 22 in the event of an arc fault. For example, the blocking portion 54 may be sized to cover the ventilation openings 22 and may include raised features that fit into the ventilation openings 22. As shown in FIG. 2, the blocking portion 54 may be described as a metal plate, generally flat and without any openings or cuts in order to block the exhaust from an arc fault from passing through the ventilation openings 22 when positioned adjacent to the ventilation openings 22. Alternatively, the blocking portion 54 may include openings that are offset from the ventilation openings 22 when positioned adjacent to the ventilation openings 22. In other words, an object passing straight through the ventilation openings 22 would not be able to pass through the openings of the blocking portion 54 when the blocking portion 54 is positioned adjacent to the ventilation openings 22.

The deformable portions 56 are configured to deform in response to a level of pressure being applied to the isolation assembly 40 from an arc fault. In other words, the deformable portions 56 plastically deform to carry the blocking portion 46 toward the ventilation openings 22. Plastic deformation refers to the deformation of a material undergoing non-reversible changes of shape in response to applied forces. In other words, after the deformable portions 56 have deformed and carried the blocking portion 54 to the ventilation openings 22, the blocking portion 54 will remain in contact with the ventilation openings 22 even after the pressure from the arc fault dissipates. In the illustrated embodiment, the deformable portions 56 include one or more slits 58 cut into the metal sheet 46. As described in detail below, the slits 58 of the deformable portions 56 open in response to pressure being applied to the blocking portion 54. The slits 58 of the deformable portions 56 may be cut into the metal sheet 46 using a variety of methods including, but not limited to, laser cutting, water jet cutting, stamping, and electrical discharge machining. Further, the slits 58 of the deformable portions 56 may be configured to extend either entirely or partially through the metal sheet 46. The arrangement, spacing, and/or pattern of the slits 58 may be configured to enable the deformable portions 56 to deform enough to carry the blocking portion 46 to the ventilation openings 22.

Mounting brackets 60 may be used as an attachment feature to couple the metal sheet 46 to the door 42 of the MCC 12. The mounting brackets 60 may be configured in a variety of ways to both securely attach the metal sheet 46 to the door 42 of the MCC 12 and to provide a separation distance 62 between the metal sheet 46 and the door 42. For example, the mounting brackets 60 may be Z-shaped, C-shaped, or I-shaped. In addition, the mounting brackets may be made from metals including, but not limited to, steel, aluminum, and alloys of steel and/or aluminum. In addition, the separation distance 62 is configured to provide enough of a gap for adequate ventilation during normal operation, but not to exceed the distance the deformable portions 56 are capable of carrying the blocking portion 46 in response to an arc fault. In certain embodiments, the separation distance 62 may be between approximately 3 mm to 20 mm, 5 mm to 15 mm, or 8 mm to 12 mm. Moreover, the mounting brackets 60 may be attached to the door 42 and the metal sheet 46 using a variety of methods including, but not limited to, welding and mechanical fasteners, such as bolts 64. The bolts 64 may be installed using washers 66 and nuts (not shown).

As shown in FIG. 2, the isolation assembly 40 includes few components. In addition, the components of the isolation assembly 40 may not typically move during normal operation and thus, may avoid failure from fatigue. Moreover, the simple method of operation of the isolation assembly 40 reduces the possibility of failure during an arc fault. Thus, various embodiments of isolation assemblies described herein may be reliable, robust, durable, and inexpensive.

Figure 3:
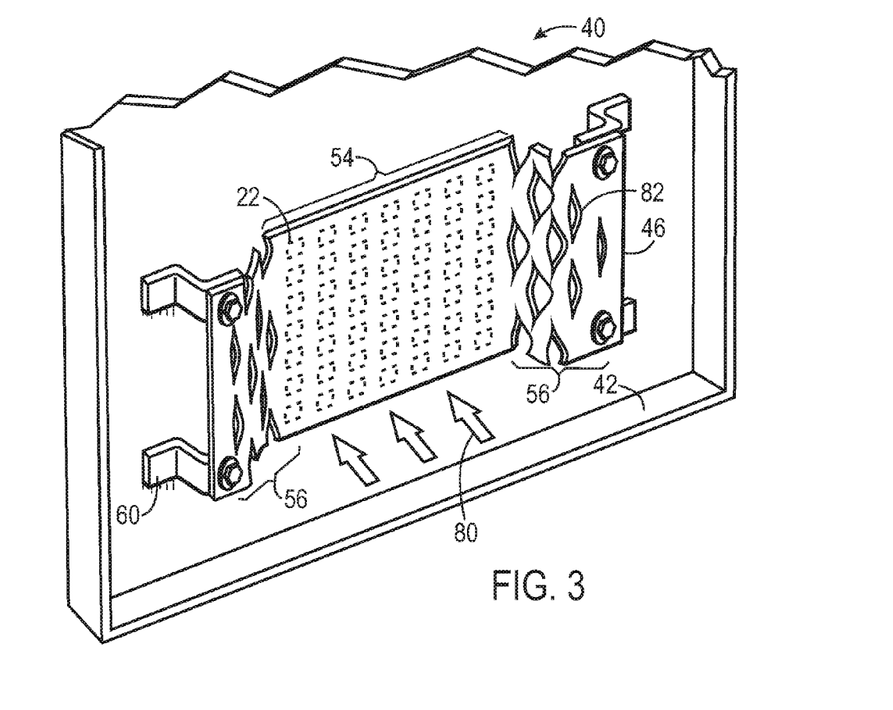
FIG. 3 is a perspective view of an isolation assembly located inside an MCC after an arc fault in accordance with an embodiment of the present invention.

FIG. 3 is a perspective view of the isolation assembly 40 shown after an arc fault. Elements in FIG. 3 in common with those shown in FIG. 2 are labeled with the same reference numerals. As described above, the temperatures reached during an arc fault may be high enough to cause metal to melt and even to vaporize. The change in state from solid to gas results in a large increase in volume, which may cause a large pressure wave 80. For example, copper going from a solid to a gas may increase in volume over 64,000 times. Therefore, the pressure inside the MCC 12 after an arc fault may increase by approximately 30, 50, 75, or 100 kilopascals (gauge pressure) or more in less than 15 milliseconds. The pressure wave 80 may extend in all directions from the vaporizing metal and be exerted on the blocking portion 54, carrying it toward the ventilation openings 22 and substantially blocking the ventilation openings 22. In other words, the blocking portion 54 is pushed by the pressure wave 80 until the separation distance 62 between the blocking portion 54 and the inside surface of the door 42 is minimized or reduced to zero. Thus, the amount of exhaust that may escape through the ventilation openings 22 is minimized.

The slits 58 of the deformable portions 56 stretch into openings 82 to enable the blocking portion 54 to move toward the door 42 of the MCC 12. The openings 82 enable the deformable portions 56 to deform, or stretch, without breaking or separating from the blocking portion 54. In addition, because the deformable portions 56 undergo plastic deformation, the deformable portions 56 remain deformed even after the pressure wave 80 has dissipated, keeping the blocking portion 54 against the ventilation openings 22. Thus, the isolation assembly 40 is configured to provide isolation during one arc fault, after which, it is understood that the affected MCC 12, its internal components, and the isolation assembly 40 will be removed and replaced. In addition, the configuration of the slits 58 in the deformable portions 56, the material selected for the metal sheet 46, and the thickness 52 of the metal sheet 46 may be adjusted to enable the blocking portion 54 to be carried to the ventilation openings 22 as quickly as the pressure wave 80 develops, minimizing the escape of exhaust. In other embodiments, the blocking portion 54 is formed from a more rigid material and the deformable portions 56 are formed from a more malleable material. In further embodiments, the blocking portion 54 and deformable portions 56 may differ in composition (e.g. different metals), thickness, and/or be formed from separate pieces that are then joined together.

Figure 4:
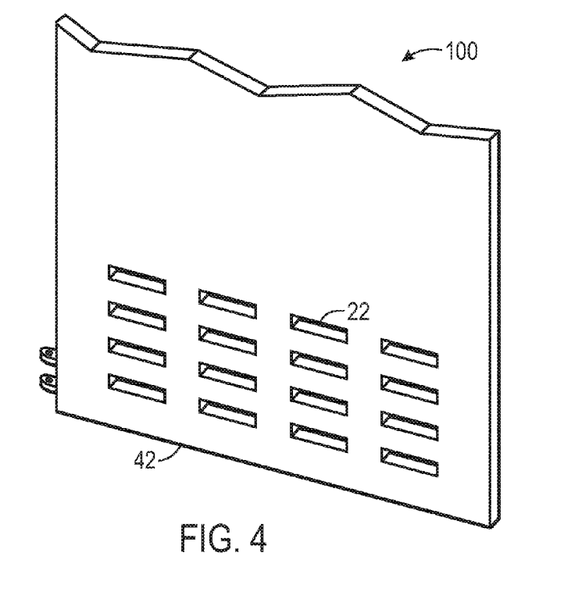
FIG. 4 is a perspective view of a door of an MCC with ventilation openings in accordance with an embodiment of the present invention.

FIG. 4 is a perspective view of an exterior surface of a door 42 to which an isolation assembly 100 is mounted. In the illustrated embodiment, the ventilation openings 22 are shaped as rectangles instead of the square-shaped ventilation openings 22 shown in FIGS. 2 and 3. The ventilation openings 22 may be cut into the door 42 using a variety of methods including, but not limited to, laser cutting, water jet cutting, stamping, and electrical discharge machining. In addition, the rectangular-shaped ventilation openings 22 may be similar in general size and shape to the rectangular-shaped blocking portions 54 described below. Thus, the ventilation openings 22 may be configured in any shape, size, or pattern to correspond with the particular configuration of an isolation assembly.

Figure 5:
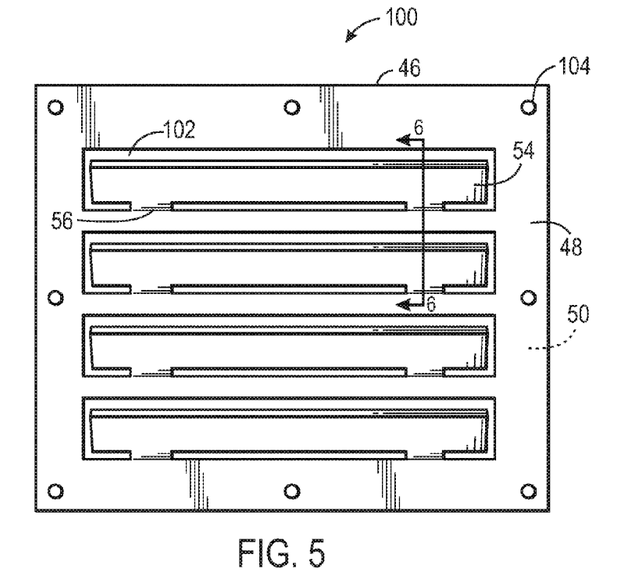
FIG. 5 is a front view of an isolation assembly located inside an MCC in accordance with an embodiment of the present invention.

FIG. 5 is a front view of the isolation assembly 100 that may be used with the ventilation openings 22 shown in FIG. 4. Elements in FIG. 5 in common with those shown in FIG. 2 are labeled with the same reference numerals. In FIG. 5, the inner surface 48 of the metal sheet 46 of the isolation assembly 100 faces the observer and the outer surface 50 is located on the opposite side of the metal sheet 46. The metal sheet 46 may be made from aluminum or steel, for example. One or more blocking portions 54 may be cut into the metal sheet 46 using methods such as, but not limited to, laser cutting, water jet cutting, stamping, and electrical discharge machining. Material removed from the metal sheet 46 to form the blocking portions 54 may result in a gap 102 between the metal sheet 46 and the blocking portions 54. Depending on the method used to cut the metal sheet 46, the width of the gap 102 may be small. In addition, the shape of the blocking portions 54 may be rectangular to correspond with the rectangular ventilation openings shown in FIG. 4. The blocking portions 54 may also be larger than the ventilation openings 22 to help reduce the quantity of exhaust from an arc fault escaping the MCC 12 and to prevent the blocking portions 54 from passing through the ventilation openings 22. In other words, the blocking portions may be taller and wider than the ventilation openings 22.

Further, the blocking portions 54 are not completely cut from the metal sheet 46, but instead remain connected at one or more deformable portions 56. In other words, the deformable portions 56 are uncut segments of the metal sheet 46 that enable the blocking portions 54 to remain joined with the metal sheet 46. Thus, the blocking portions 54 may be described as metal flaps. The size of the deformable portions 56 may be configured to enable the blocking portions 54 to be carried rapidly toward the ventilation openings 22 in the event of an arc fault. In other words, smaller deformable portions 56 may enable the blocking portions 54 to be carried faster toward the ventilation openings 22. Moreover, during normal operation, the blocking portions 54 are bent toward the observer. In other words, the blocking portions 54 bend away from the door 42 and toward the internal components of the MCC 12. Thus, in the event of an arc fault, the blocking portions 54 bend toward and substantially block the ventilation openings 22. The isolation assembly 100 may be coupled to the door 42 by passing bolts 64 through one or more mounting holes 104 arranged around the perimeter of the metal sheet 46. Alternatively, the metal sheet 46 may be attached to the door 42 using other methods, such as welding. Although shown with blocking portions 54 for one column of ventilation openings 22, in other embodiments, the metal sheet 46 may include more than one column of blocking portions 54 or other arrangements of blocking portions 54. Although configured differently from the isolation assembly 40 shown in FIGS. 2 and 3, the isolation assembly 100 provides similar advantages in terms of reliability, robustness, and expense, for example.

Figure 6:
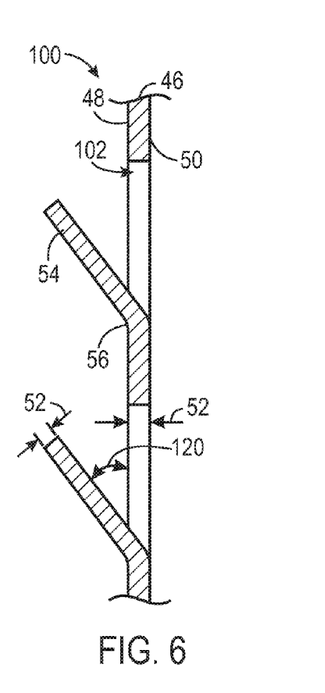
FIG. 6 is a side view of an isolation assembly in accordance with an embodiment of the present invention.

To illustrate the blocking portions 54 from a different perspective, FIG. 6 is a side view of the isolation assembly 100 along the line labeled 6-6 in FIG. 5. Elements in FIG. 6 in common with those shown in FIG. 5 are labeled with the same reference numerals. In the illustrated embodiment, the blocking portions 54 are bent away from the metal sheet 46 at an angle 120. In certain embodiments, the angle 120 may be less than approximately 85 degrees, 75 degrees, 60 degrees, 45 degrees, or 10 degrees. The particular value selected for the angle 120 may depend on the location of the ventilation openings 22 on the door and from where the pressure wave 80 originates. In addition, because the blocking portions 54 are cut from the metal sheet 46, the thickness 52 of the blocking portions 54 is the same as the thickness 52 of the metal sheet 46 in the illustrated embodiment.

Figure 7:
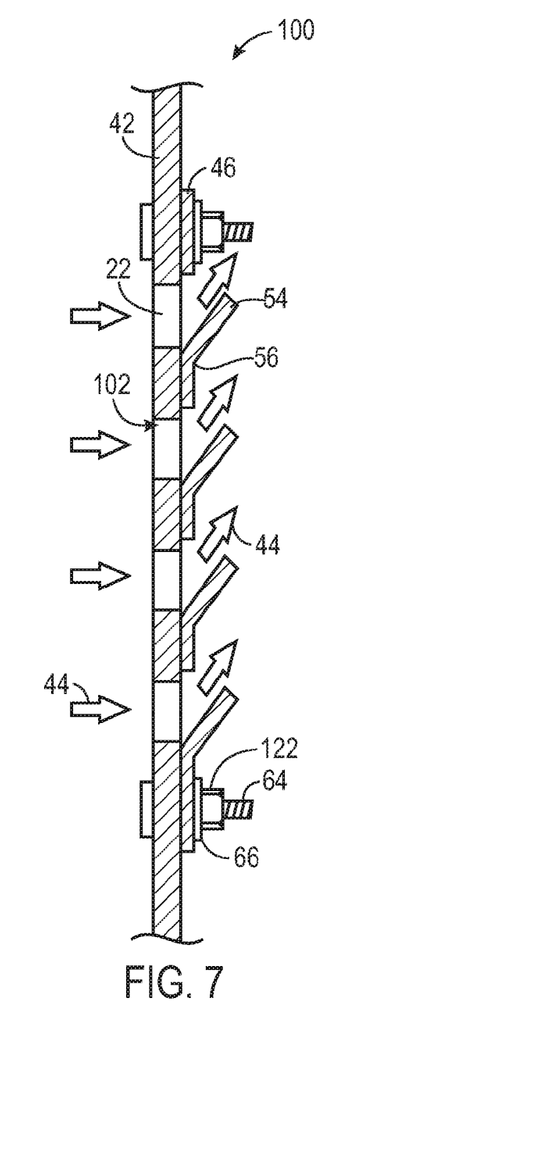
FIG. 7 is a side view of an isolation assembly coupled to a door of an MCC in accordance with an embodiment of the present invention.

FIG. 7 shows a side view of the isolation assembly 100 attached to the door 42 of the MCC 12 during normal operation. Elements in FIG. 7 in common with those shown in FIGS. 5 and 6 are labeled with the same reference numerals. Bolts 64 may be used to couple the isolation assembly 100 to the door 42 of the MCC 12. In addition, washers 66 and nuts 122 may be used to complete the installation. Thus, there may not be a need for mounting brackets 60, such as those shown in FIG. 2. Alternatively, the isolation assembly 100 may be welded to the door 42. In the illustrated embodiment, fresh air 44 passes through the ventilation openings 22 and across the blocking portions 54 into the MCC 12. The blocking portions 54 may be configured to direct the fresh air 44 toward the internal components of the MCC 12. In addition, the blocking portions 54 help to reduce the possibility of foreign objects extending into the interior of the MCC 12, while still providing adequate ventilation of the MCC 12.

Figure 8:
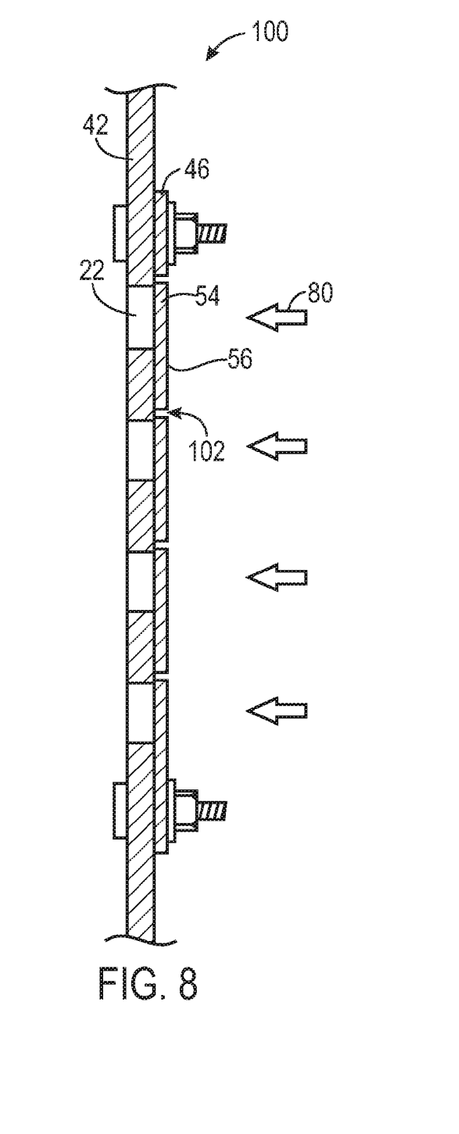
FIG. 8 is a side view of an isolation assembly after an arc fault in accordance with an embodiment of the present invention.

FIG. 8 shows a side view of the isolation assembly 100 after an arc fault. Elements in FIG. 8 in common with those shown in earlier figures are labeled with the same reference numerals. The pressure wave 80 resulting from the arc fault pushes against the blocking portions 54 and causes the deformable portions 56 to bend, enabling the blocking portions 54 to substantially block the ventilation openings 22. Thus, the amount of exhaust from the arc fault escaping from the interior of the MCC 12 may be reduced. Because the blocking portions 54 may be taller than the ventilation openings 22, the gap 102 caused by the cutting process may not interfere with the blocking of the exhaust from the arc fault. In other words, the gap 102 may be located across from a solid portion of the door 42, instead of across from a portion of the ventilation opening 22. In other embodiments, the width of the gap 102 may be smaller or larger, depending on the method used to cut the metal sheet 46.

Figure 9:
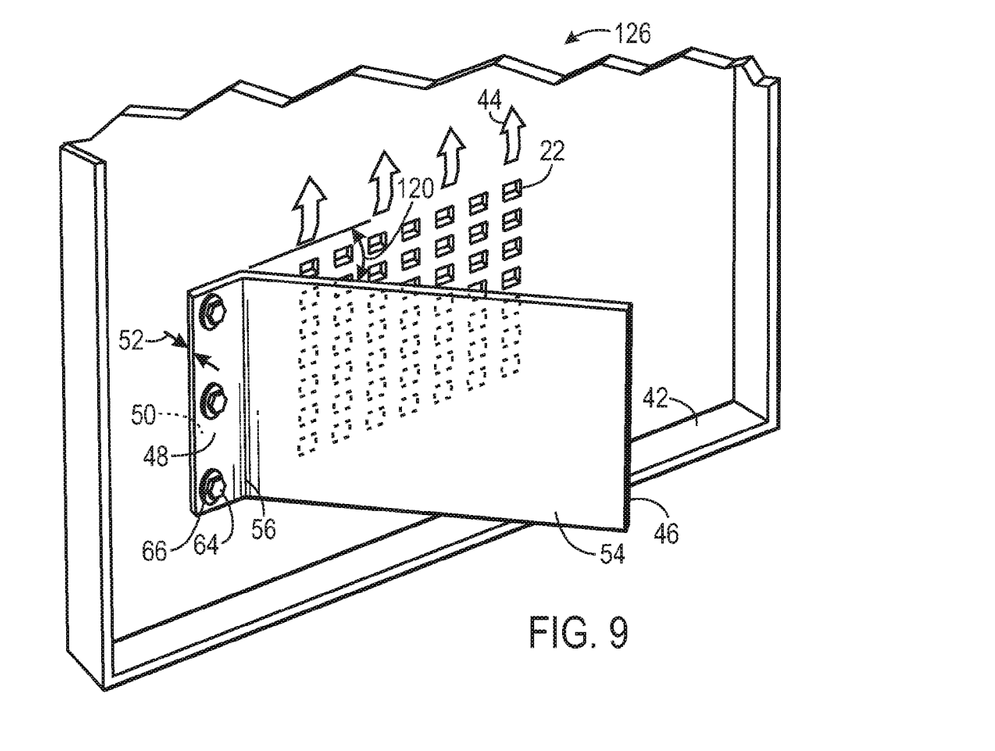
FIG. 9 is a perspective view of an isolation assembly located inside a door of an MCC in accordance with an embodiment of the present invention.

FIG. 9 is a perspective view of an isolation assembly 126 that combines elements from the isolation assemblies 40 and 100. Elements in FIG. 9 in common with those shown in earlier figures are labeled with the same reference numerals. As with the isolation assembly 40 shown in FIG. 2, the blocking portion 54 may be appear as a metal plate, generally flat and without any openings in order to block the exhaust from an arc fault from passing through the ventilation openings 22 when positioned adjacent the ventilation openings 22. Alternatively, the blocking portion 54 may include openings that are offset from the ventilation openings 22 as described above. In the event of the arc fault, the pressure wave acts on the surface of the blocking portion to push it against the ventilation openings 22. The deformable portion 56 is configured similarly to the isolation assembly 100 shown in FIGS. 5-8. In other words, the deformable portion 56 consists of a bend in the metal sheet 46. Thus, the blocking portion 54 may be configured at angle 120 from the surface of the door 42 of the MCC 12. The angle 120 may be configured to enable adequate ventilation of the MCC 12 during normal operation, while still allowing the blocking portion 54 to be carried rapidly toward the ventilation openings 22 in the event of an arc fault. Further, the isolation assembly 126 may be secured directly to the door 42 of the MCC 12 using bolts 64 or welding, without using mounting brackets 60. Other aspects of the isolation assembly 126 are similar to those of isolation assemblies 40 and 100. In some embodiments, slits or openings may be included in the deformable portion 56 of the isolation assembly 126 to facilitate plastic deformation in the event of an arc fault.

Figure 10:
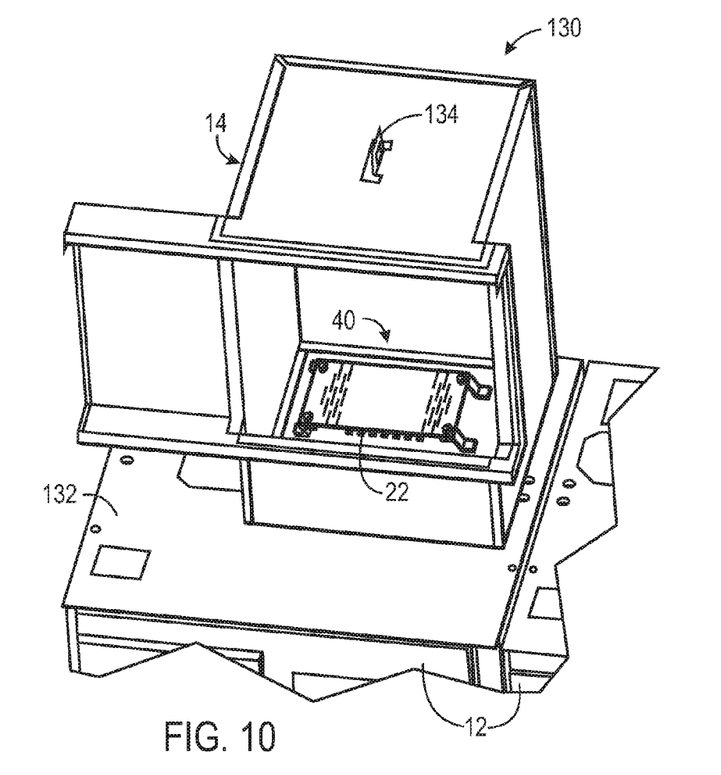
FIG. 10 is a perspective view of an isolation assembly located in an exhaust plenum at the top of an MCC in accordance with an embodiment of the present invention.

FIG. 10 is a perspective view of an isolation assembly located in the exhaust plenum 14 of an MCC 12. Elements in FIG. 10 in common with those shown in earlier figures are labeled with the same reference numerals. The exhaust plenum 14 may be located on the top surface 132 of the MCC 12. The plenum 14 may include a mechanical support attachment 134, allowing support of the plenum 14 from the ceiling, wall, or floor of the electrical control room. For example, the plenum 14 may include flanges for installing hangers, or may include holes for any other type of mechanical support. Additionally, the supports may act as bracing mechanisms in the event of an arc fault, or additional bracing mechanisms may be used to provide additional support. The number and type of supports, and the number and type of bracings, may depend on how the plenum 14 is supported at its outlet, as well as the distance of the outlet from the MCCs 12.

In the illustrated embodiment, the exhaust plenum 14 may include ventilation openings 22 and the isolation assembly 40. Other embodiments of isolation assemblies, such as assemblies 100 or 126, and configurations of ventilation openings 22 may be used as well. The ventilation openings 22 may enable warm air to escape out through the top of the MCC 12 or may enable fresh air 44 to enter the MCC 12. As several MCCs 12 may be interconnected through the exhaust plenum 14, an arc fault in one MCC 12 may propagate into adjacent MCCs 12 through the ventilation openings 22. The isolation assembly 40 may be mounted on the exterior side of the MCCs 12 to help reduce the amount of exhaust from an arc fault that can ingress. Thus, the damage resulting from an arc fault may be limited to the MCC 12 in which the arc fault occurs. Moreover, the separation distance 62 between the isolation assembly 40 and the ventilation openings 22 helps to reduce the possibility of the exhaust exiting the MCC 12 experiencing an arc fault being restricted excessively. In some embodiments, the isolation assembly 40 may even be configured to be blown away from the MCC 12 experiencing an arc fault. In other embodiments, the isolation assembly 40 may include a capture mechanism to reduce the possibility of the isolation assembly damaging the plenum 14. In further embodiments, the MCCs 12 may be provided with isolation assemblies 40 at both the front of the MCC 12 and in the plenum 14, only on the front of the MCC 12, only in the plenum 14, or in other configurations.

Figure 11:
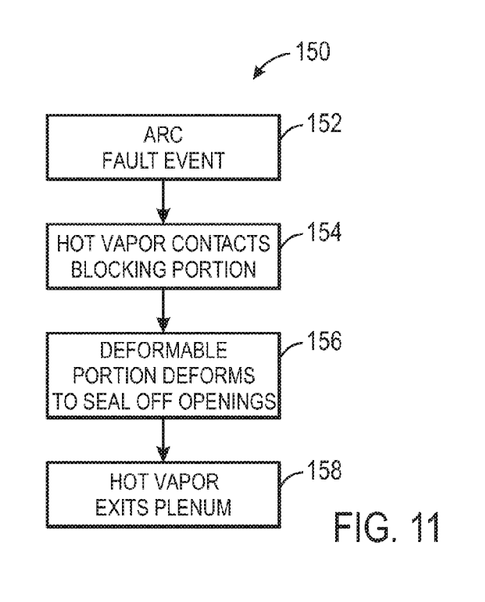
FIG. 11 is a flow chart of a process for rapidly isolating an MCC after an arc fault in accordance with an embodiment of the present invention.

FIG. 11 is a flow chart of a process for isolating an MCC 12 during an arc fault. In the first step 152, the arc fault event occurs in the MCC 12, generating hot vapor and the resulting pressure wave 80. Next, in step 154, the hot vapor contacts the blocking portion 54. Almost simultaneously, in step 156, the deformable portion 56 plastically deforms because of pressure on the blocking portion 54 and the deformable portion 56 to carry the blocking portion 54 toward the ventilation opening 22, substantially blocking the ventilation opening 22. Thus, in step 158, the hot vapor is redirected from exiting through the ventilation openings 22 and exits through the plenum 14 of the MCC 12. Therefore, the isolation assembly helps to reduce the amount of exhaust from the arc fault exiting through the ventilation openings 22 of the MCC 12 and possibly causing damage. Afterwards, the blocking portion 54 remains against the ventilation openings 22 because of the plastic deformation of the deformable portion 56.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
    an electrical enclosure having a ventilation opening;
    an isolation assembly comprising a metal sheet, wherein the metal sheet comprises a deformable portion and a blocking portion, wherein the blocking portion is capable of substantially blocking the ventilation opening with a blocking surface of the metal sheet and wherein the deformable portion comprises slits extending at least partially through the metal sheet, wherein the slits are configured to plastically deform into openings in response to a level of pressure being applied to the metal sheet from with the electrical cabinet such that the deformable portion plastically deforms and carries the blocking surface toward the ventilation opening; and
    an attachment feature configured to couple the metal sheet to the electrical enclosure adjacent the ventilation opening in the electrical enclosure.

2. The system of claim 1, wherein the electrical enclosure has a plurality of ventilation openings, and the blocking portion of the metal sheet is capable of blocking the plurality of ventilation openings.

3. The system of claim 1, wherein the isolation assembly is coupled to an inner surface of the electrical enclosure such that the deformable portion is configured to deform to carry the blocking surface toward the inner surface when the level of pressure is reached within the electrical enclosure.

4. The system of claim 1, wherein the isolation assembly is disposed on a door of the electrical enclosure.

5. The system of claim 1, wherein the metal sheet comprises the blocking portion and two deformable portions, wherein the blocking portion is disposed between the two deformable portions.

6. The system of claim 1, wherein each of the slits is oriented in a first direction, and wherein the slits are configured to plastically deform into openings such that opposing edges of each slit separate from each other.

7. The system of claim 6, wherein the deformable portion is configured to plastically deform to carry the blocking surface toward the ventilation opening in a second direction substantially perpendicular to the first direction.

8. The system of claim 1, wherein the slits are oriented substantially parallel to each other and are offset relative to each other such that the slits are configured to plastically deform into a grating pattern of openings in response to the level of pressure being applied to the metal sheet.

9. The system of claim 1, wherein the blocking portion comprises a flat portion of the metal sheet without any openings or cuts.

10. The system of claim 1, wherein the blocking portion includes a plurality of raised features, wherein each of the plurality of raised features of the blocking portion is aligned with one of a plurality of ventilation openings such that the raised features fit into the ventilation openings.

11. The system of claim 1, wherein the metal sheet is flat when the deformable portion is not deformed, and wherein the metal sheet is bent when the deformable potion is deformed to carry the blocking portion toward the ventilation opening.

12. An isolation assembly for use in an electrical enclosure, comprising:
    a metal sheet, comprising:
        a blocking portion capable of substantially blocking a ventilation opening in the electrical enclosure with a blocking surface of the metal sheet; and
        a deformable portion comprising slits extending at least partially through the metal sheet, wherein the slits are configured to plastically deform into openings in response to a level of pressure being applied to the metal sheet from within the electrical enclosure such that the deformable portion plastically deforms and carries the blocking portion toward the ventilation opening; and
    an attachment feature configured to couple the metal sheet to the electrical enclosure adjacent the ventilation opening in the electrical enclosure.

13. The isolation assembly of claim 12, wherein the attachment feature offsets the metal sheet from the ventilation opening by a distance when the deformable portion is not deformed and wherein the deformable portion is capable of plastically deforming such that the blocking portion is carried the distance toward the ventilation opening.

14. The isolation assembly of claim 12, comprising attachment features configured to couple at least two opposite ends of the metal sheet to the electrical enclosure, wherein the metal sheet comprises two deformable portions, each deformable portion disposed between one of the ends of the metal sheet and the blocking portion.

15. The isolation assembly of claim 12, wherein each of the slits is oriented in a first direction, and wherein the slits are configured to plastically deform into openings such that opposing edges of each slit separate from each other.

16. The isolation assembly of claim 12, wherein the slits are oriented substantially parallel to each other and are offset relative to each other such that the slits are configured to plastically deform into a grating pattern of openings in response to the level of pressure being applied to the metal sheet.

17. A method, comprising:
   substantially blocking a ventilation opening of an electrical enclosure using a blocking portion of a metal sheet; and
   plastically deforming slits into openings, the slits extending at least partially through deformable portion of the metal sheet, in response to a level of pressure being applied to the metal sheet from within the electrical enclosure such that the deformable portion plastically deforms and carries the blocking portion toward the ventilation opening.

18. The method of claim 17, comprising plastically deforming slits extending through two deformable portions of the metal sheet disposed on opposite sides of the blocking portion of the metal sheet.

19. The method of claim 17, comprising plastically deforming the slits into openings such that opposing edges of each slit separate from each other, wherein each slit is oriented in a first direction, such that the deformable portion plastically deforms to carry the blocking portion of the metal sheet toward the ventilation opening in a second direction substantially perpendicular to the first direction.

* * * * *